(12) United States Patent
Roesner et al.

(10) Patent No.: US 10,032,670 B2
(45) Date of Patent: Jul. 24, 2018

(54) PLASMA DICING OF SILICON CARBIDE

(71) Applicant: Infineon Technologies AG, Neubiberg (DE)

(72) Inventors: Michael Roesner, Villach (AT); Manfred Engelhardt, Villach-Landskron (AT); Gudrun Stranzl, Goedersdorf (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 15/182,387

(22) Filed: Jun. 14, 2016

(65) Prior Publication Data
US 2017/0358494 A1    Dec. 14, 2017

(51) Int. Cl.
| | |
|---|---|
| *H01L 21/00* | (2006.01) |
| *H01L 21/78* | (2006.01) |
| *H01L 21/3065* | (2006.01) |
| *H01L 21/67* | (2006.01) |
| *H01L 29/16* | (2006.01) |
| *H01L 23/495* | (2006.01) |
| *H01J 37/32* | (2006.01) |

(52) U.S. Cl.
CPC ........ *H01L 21/78* (2013.01); *H01J 37/32009* (2013.01); *H01J 37/3244* (2013.01); *H01L 21/3065* (2013.01); *H01L 21/67069* (2013.01); *H01L 21/67109* (2013.01); *H01L 23/4952* (2013.01); *H01L 23/49513* (2013.01); *H01L 23/49562* (2013.01); *H01L 29/1608* (2013.01); *H01J 2237/334* (2013.01)

(58) Field of Classification Search
USPC ........................................................ 438/460
See application file for complete search history.

(56) References Cited

U.S. PATENT DOCUMENTS

| | | | | |
|---|---|---|---|---|
| 5,240,871 | A | * 8/1993 | Doan | ............... H01L 27/10817 257/E21.017 |
| 5,716,494 | A | * 2/1998 | Imai | .................. H01L 21/30604 257/E21.219 |
| 5,926,743 | A | 7/1999 | Xi et al. | |
| 7,166,535 | B2 | 1/2007 | Li et al. | |

(Continued)

OTHER PUBLICATIONS

Choi, H., et al., "Overview of Silicon Carbide Power Devices," Fairchild Semiconductor, received May 11, 2016, 6 pages.

(Continued)

*Primary Examiner* — Timor Karimy
(74) *Attorney, Agent, or Firm* — Slater Matsil, LLP

(57) ABSTRACT

A method of forming a semiconductor device includes forming an active region in a first side of a silicon carbide substrate, the silicon carbide substrate having a second side opposite the first side and forming a contact pad at the first side. The contact pad is coupled to the active region. The method further includes forming an etch stop layer over the contact pad and plasma dicing the silicon carbide substrate from the second side. The plasma dicing etches through the silicon carbide substrate and stops on the etch stop layer. The diced silicon carbide substrate is held together by the etch stop layer. The diced silicon carbide substrate is attached on a carrier. The diced silicon carbide substrate is separated into silicon carbide dies by cleaving the etch stop layer.

27 Claims, 16 Drawing Sheets

(56) References Cited

U.S. PATENT DOCUMENTS

| | | | | |
|---|---|---|---|---|
| 2007/0196999 A1* | 8/2007 | Tamura | ............... | H01L 21/84 438/458 |
| 2009/0101936 A1* | 4/2009 | Kamei | ............... | H01L 33/16 257/103 |
| 2014/0008805 A1* | 1/2014 | Mayer | ............... | H01L 21/78 257/772 |
| 2015/0147850 A1* | 5/2015 | Stranzl | ............... | H01L 21/3065 438/118 |

OTHER PUBLICATIONS

Chun, D. H., et al., "Novel SiC Junction Barrier Schottky Diode Structure for Efficiency Improvement of EV Inverter," EVS28, Kintex, Korea, May 3-6, 2015, pp. 1-5.

Dahlquist, F., "Junction Barrier Schottky Rectifiers in Silicon Carbide," KTH, Royal Institute of Technology, Department of Microelectronics and Information Technology, Stockholm, 2002, 74 pages.

Fengping, C., et al., "Fabrication and characteristics of a 4H-SiC junction barrier Schottky diode," Journal of Semiconductors, vol. 32, No. 6, Jun. 2011, pp. 064003-1-064003-3.

Green, S. et al., "Damage-Free Dicing of SiC Wafers by Water-Jet-Guided Laser," CS MANTECH Conference, Apr. 24-27, 2006, Vancover, British Columbia, Canada, pp. 145-146.

Habuka, H., "Etching of Silicon Carbide Using Chlorine Trifluoride Gas," Physics and Technology of Silicon Carbide Devices, received May 18, 2016, pp. 99-129.

Ying, W., et al., "Junction barrier Schottky rectifier with an improved P-well region," Chin. Phys. B, vol. 21, No. 12, 2012, 6 pages.

Miura, Y., et al., "Determination of Etch Rate Behavior of 4H-SiC Using Chlorine Trifluoride Gas," Japanese Journal of Applied Physics, vol. 46, No. 12, Dec. 2007, pp. 7875-7879.

Palmour, J. W., "Future High Voltage Silicon Carbide Power Devices," Workshop on Future CO2 Compression Systems, Mar. 31, 2009, 23 pages.

Wijesundara, M., et al. "Silicon Carbide Microsystems for Harsh Environments," 2011, pp. 33-95.

* cited by examiner

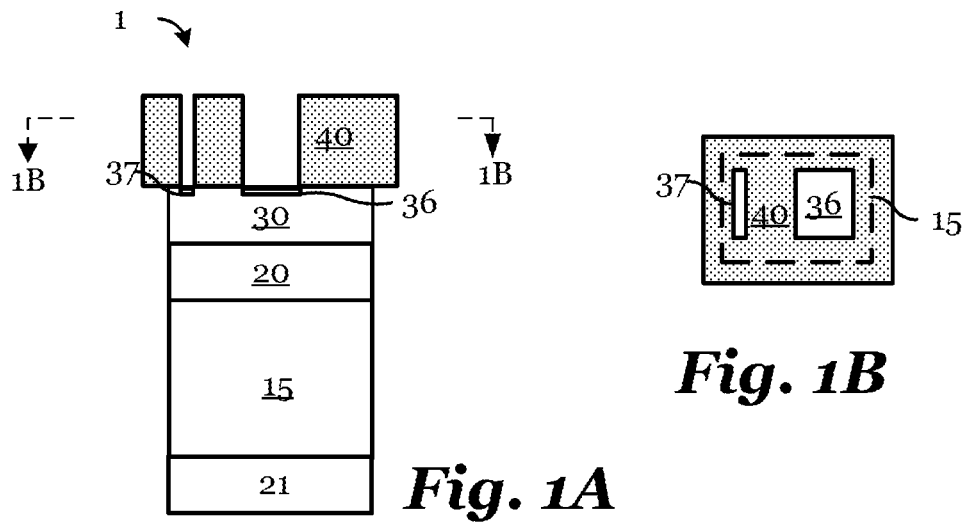
*Fig. 1A*
*Fig. 1B*
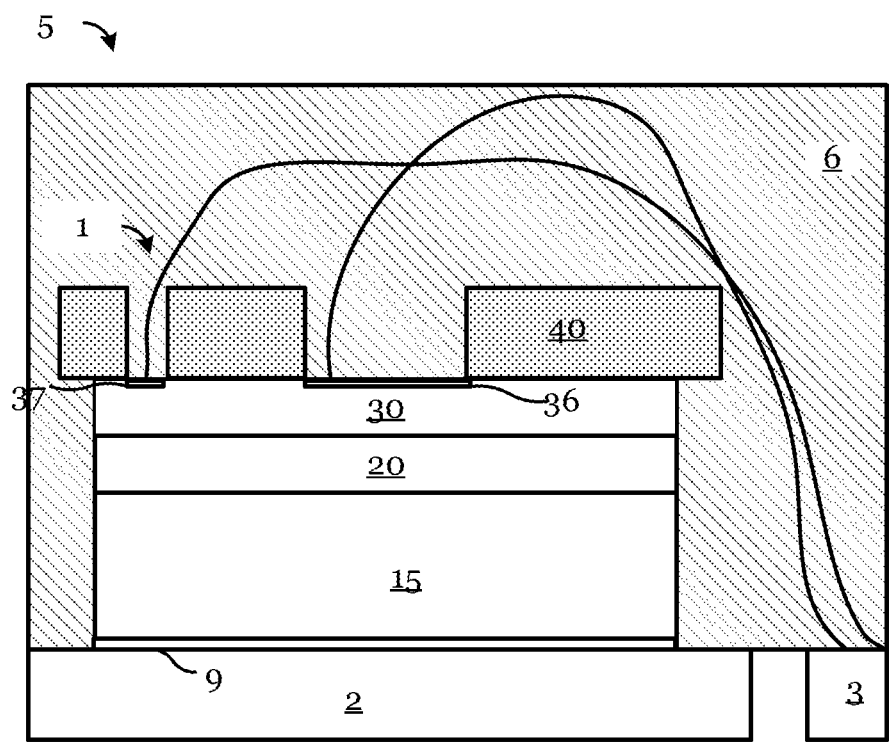
*Fig. 1C*

PLASMA DICING OF SILICON CARBIDE

TECHNICAL FIELD

The present invention relates generally to semiconductor processing, and, in particular embodiments, to plasma dicing of silicon carbide.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

Each semiconductor wafer is fabricated to include a plurality of dies. After fabricating the semiconductor devices on the semiconductor wafer, individual semiconductor dies are formed by dividing the wafer into multiple dies. The dividing, which is also referred to as singulation or dicing, is typically performed using a sawing process at the end of the fabrication.

SUMMARY

In accordance with an embodiment of the present invention, a method of forming a semiconductor device includes forming an active region in a first side of a silicon carbide substrate, the silicon carbide substrate comprising a second side opposite the first side and forming a contact pad at the first side, the contact pad being coupled to the active region. The method further includes forming an etch stop layer over the contact pad and plasma dicing the silicon carbide substrate from the second side. The plasma dicing etches through the silicon carbide substrate and stops on the etch stop layer. The diced silicon carbide substrate is held together by the etch stop layer. The diced silicon carbide substrate is attached on a carrier. The diced silicon carbide substrate is separated into individual silicon carbide dies by cleaving the etch stop layer.

In accordance with an alternative embodiment, a method of forming a power semiconductor device includes providing a silicon carbide substrate comprising a first side and a second side opposite the first side and doping a portion of the silicon carbide substrate to form an active region from the first side. The method further includes forming a ceramic stabilization layer over the active region, and thinning, from the second side, the silicon carbide substrate to expose a major surface. The method further includes forming a patterned mask layer under the exposed major surface of the silicon carbide substrate, and etching through the silicon carbide substrate to expose the ceramic stabilization layer using an etch chemistry comprising an interhalogen compound comprising chlorine and fluorine and the patterned mask layer as an etch mask.

In accordance with an alternative embodiment, a plasma etching tool comprises a plasma chamber, an inlet for an inter-halogen gas, an outlet for the inter-halogen gas, electrodes for generating a plasma from the inter-halogen gas, and a heating unit for heating a wafer to be etched using the plasma.

In accordance with an alternative embodiment, a power semiconductor device comprises a silicon carbide substrate, a back side metallization layer disposed on one side of the silicon carbide substrate, a front side metallization layer disposed on an opposite side of the silicon carbide substrate, and a etch stop layer supporting the silicon carbide substrate and disposed over the front side metallization layer. The etch stop layer has a larger foot print than the silicon carbide substrate and comprising openings to contact pads in the front side metallization layer.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A is a cross-sectional view of a semiconductor device in accordance with an embodiment of the present invention and FIG. 1B is a corresponding sectional top view of the semiconductor device;

FIG. 1C comprises a cross-sectional view of a semiconductor device after assembly in accordance with an embodiment of the present invention;

DETAILED DESCRIPTION OF ILLUSTRATIVE EMBODIMENTS

Figure 2A:
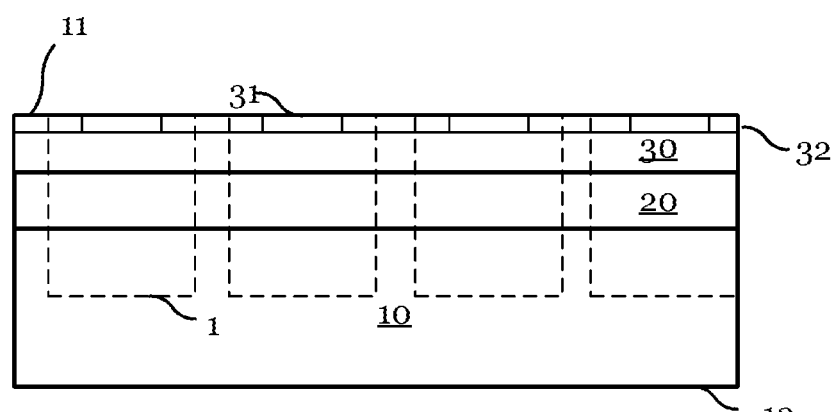
FIG. 2A illustrates a cross-sectional view of a semiconductor device during fabrication in accordance with an embodiment of the present invention.

Silicon carbide is an attractive choice for power semiconductor devices due to the wider band gap relative to silicon. Silicon carbide devices have many applications especially in power conversion due to the higher breakdown field strength and thermal conductivity. For example, the wider band gap can support a larger voltage in a smaller size device. While the theoretical advantages of using silicon carbide over silicon as the base semiconductor material are well established, the adoption of this technology is limited due to practical consideration related to fabrication of devices in silicon carbide substrates.

Further, modern semiconductor chips are being manufactured at reduced thickness to improve performance, for example, by reducing thermal effects and reducing substrate resistance. Thin silicon carbide chips would be beneficial for high power applications. However, very thin silicon carbide chips require processing of thin silicon carbide wafers, which may be thinner than 60 µm. Further, power devices require thick metallization that when combined with these thin silicon carbide wafers can result in reliability issues. For example, conventional sawing techniques are inadequate to dice silicon carbide wafers. Dicing a silicon carbide wafer after processing using a conventional sawing process introduces many defects. This is because silicon carbide is extremely hard (many times harder than silicon). In fact, silicon carbide is in one of the hardest material class of materials after diamond, boron nitride, and boron carbide. For example, diamond has a Mohs hardness of 10, while boron nitride has a Mohs hardness of 9.5-10 and silicon carbide has a Mohs is between 9 to 9.5. This contrasts sharply with silicon, which is around 6-7. Therefore, sawing silicon carbide requires the use of very hard blades, for example, having a diamond/boron carbide tip. Despite using such extremely hard materials, sawing blades wear off easily and even break during the dicing step. Breakdown in tool can result in expensive down times. Even then, the chip that is being produced may also face significant damage. For example, sawing may also not be clean resulting in uneven sidewalls that may initiate die edge chipping, crack growth, and/or delamination of different layers. Further, the sawing process is very slow and generates significant heat that can result in deleterious side effects. Thus, low cost and fast dicing techniques will facilitate mass production of silicon carbide dies.

Embodiments of the present invention describe a high rate (fast) and low cost process for dicing silicon carbide wafers. A structural embodiment will be described using FIGS. 1A-1C. Various methods of fabricating these devices will be described using FIGS. 2-7.

FIG. 1A is a cross-sectional view of a semiconductor device in accordance with an embodiment of the present invention. FIG. 1B is a corresponding sectional top view of the semiconductor device.

Referring to FIG. 1A, a semiconductor die 1 is illustrated. The semiconductor die 1 comprises a thinned silicon carbide substrate 15 comprising a device region 20 and a metallization layer 30. The device region 20 comprises active device regions (e.g., a channel region of a field effect transistor, a base region of a bipolar transistor, a p/n junction of a diode) of the semiconductor die 1.

The semiconductor die 1 comprises a power device in one embodiment. The semiconductor die 1 comprises a vertical power MOSFET in one embodiment. Alternatively, the semiconductor die 1 comprises a lateral device. In various embodiments, the semiconductor die 1 comprises a Zener diode, a Schottky diode, PIN diode, JFET, n-channel MOSFET, p-channel MOSFET, NPN transistor, PNP transistor, IGBT, thyristor, combinations thereof, and other devices. In one embodiment, the semiconductor die 1 is a discrete power semiconductor device. In an alternative embodiment, the semiconductor die 1 is an integrated circuit.

The thinned silicon carbide substrate 15 has a hexagonal crystal structure in one embodiment. In alternative embodiments, the thinned silicon carbide substrate 15 has a cubic, or a rhombohedral crystal structure. The thinned silicon carbide substrate 15 comprises a 2H—SiC, 4H—SiC, 6H—SiC, 3C—SiC, as well as other polymorphic crystal structure in various embodiments.

The semiconductor die 1 further comprises a etch stop layer 40 disposed over the thinned silicon carbide substrate 15. The etch stop layer 40 extends beyond the sidewalls of the thinned silicon carbide substrate 15. In or more embodiments, the etch stop layer 40 comprises a cleaved surface. In one or more embodiments, the etch stop layer 40 is a ceramic layer. In various embodiments, the etch stop layer 40 may comprise e.g. alumina, yttria, aluminium nitride, aluminium oxide, yttrium nitride, yttrium oxide The etch stop layer 40 includes openings for the first and the second contact pads 36 and 37. In one embodiment, the first contact pad 36 is connected to a source or a drain of a power MOSFET device through the metallization layer 30 while the second contact pad 37 is connected to a gate or a control node of the power MOSFET through the metallization layer 30.

As is clear from FIG. 1B, the footprint of the etch stop layer 40 is larger than the thinned silicon carbide substrate 15. The etch stop layer 40 may be thicker than the thinned silicon carbide substrate 15 in one embodiment. In various embodiments, the etch stop layer 40 may help to serve as an etch stop during a plasma dicing process as well as help to mechanically support the diced semiconductor dies after plasma dicing. The various method embodiments described below will help to better understand these aspects further.

A back side metallization layer 21 may be disposed on the back side of the silicon carbide substrate 15. The back side metallization layer 21 may comprise a thick copper layer and may further comprise a solder layer. The back side metallization layer 21 may be thicker than the thinned silicon carbide substrate 15 in one embodiment.

FIG. 1C comprises a cross-sectional view of a semiconductor device after assembly in accordance with an embodiment of the present invention.

FIG. 1C illustrates a semiconductor package 5 formed using the semiconductor die 1. The semiconductor die 1 produced in various embodiments of the present invention may be assembled in a suitable package form factor. A lead frame package is illustrated only as an example. The lead frame package comprises a die paddle 2 on which the semiconductor die 1 is attached. The back side of the semiconductor die 1 is attached to the die paddle 2, for example, using a diffusion solder layer 9. The diffusion solder layer 9 may comprise intermetallic joints comprising copper-tin. The contacts pads at the front side of the semiconductor die 1 are attached to leads 3, for example, through interconnects. The interconnects may be wires that are wire bonded to the leads 3 or may be other types of interconnects.

As described above, an etch stop layer 4 comprising a ceramic material is part of the semiconductor die 1. The openings in the etch stop layer 4 are used to contact the first and the second contact pads 36 and 37 on the front side of the semiconductor die 1. The semiconductor die 1 may be encapsulated within an encapsulant 6.

FIG. 2A illustrates a cross-sectional view of a semiconductor device during fabrication in accordance with an embodiment of the present invention.

Referring to FIG. 2A, a silicon carbide substrate 10 after the completion of front end processing and back end processing is illustrated. The silicon carbide substrate 10 has a plurality of semiconductor devices, i.e., semiconductor dies 1, formed within. Each of the semiconductor dies 1 may be any type of chip.

In various embodiments, the semiconductor die 1 may comprise a power semiconductor device, which may be a discrete device in one embodiment. In one embodiment, the semiconductor die 1 is a two terminal device such as a PIN diode, Schottky diode, or a junction barrier Schottky rectifier. In one or more embodiments, the semiconductor die 1 is a three terminal device such as a power metal insulator semiconductor field effect transistor (MISFET or MOSFET), a junction field effect transistor (JFET), bipolar junction transistor (BJT), an insulated gate bipolar transistor (IGBT), or a thyristor. In additional examples, each of the semiconductor chips 1 may be a logic chip, a memory chip, an analog chip, a high power switch, and other types of chips. Each of the semiconductor chips 1 may comprise a plurality of devices such as transistors or diodes forming an integrated circuit or may be a discrete device such as a single transistor or a single diode.

As an illustration, the silicon carbide substrate 10 may be a 100 mm, 150 mm, 200 mm, or 300 mm silicon carbide wafer. In one illustration, the silicon carbide substrate 10 may be a 200 mm silicon carbide wafer, which may have a thickness of 35 μm to 750 μm while in another embodiment the silicon carbide substrate 10 may be a 150 mm silicon carbide wafer having a thickness of 35 mm to 500 mm. In further embodiments, the silicon carbide substrate 10 may be a monocrystalline epitaxial layer of SiC grown on a substrate.

The silicon carbide substrate 10 may be a monocrystalline material having a hexagonal crystal structure. The crystal structure of the silicon carbide substrate 10 may be 4H—SiC, 6H—SiC, or 3C—SiC. In one embodiment, the silicon carbide substrate 10 is a 4H—SiC substrate. The silicon carbide substrate 10 may be doped with an n-type dopant such as nitrogen or phosphorus or may be doped p-type dopant such as aluminium in various embodiments.

The surface of the silicon carbide substrate 10 may have a {0001} surface plane. However, in other embodiments, the surface may be off axis or tilted towards the <11-20> direction. In one embodiment, the surface of the silicon carbide substrate 10 may be off axis and oriented 4° or 8° towards the <11-20> direction. The surface of the silicon carbide substrate 10 may be a 6H—SiC oriented off axis 3° to 4° toward the <11-20> direction as another illustration. In other embodiments, the surface may be off-axis relative to this plane. The silicon carbide substrate 10 may include one or more epitaxial layers.

Referring to FIG. 2A, device regions 20 are disposed within the silicon carbide substrate 10. The device regions 20 may include doped regions in various embodiments. Further, some portion of the device regions 20 may be formed over the silicon carbide substrate 10. The device regions 20 may include active regions such as channel regions of transistors.

The silicon carbide substrate 10 comprises a top surface 11 and an opposite bottom surface 12 at this stage of processing. In various embodiments, the device regions 20 are formed closer to the top surface 11 of the silicon carbide substrate 10 than the bottom surface 12. Active devices may be formed in device regions 20 of the silicon carbide substrate 10. Device regions 20 extends over a depth, which depending on the device, is ranging from sub-micron up to about 50 μm from the top surface 11, and about 10 μm in one embodiment. Further, a final depth of the semiconductor die 1 will be determined after thinning as will be described subsequently.

In various embodiments, all necessary interconnects, connections, pads etc. for coupling between devices of the device regions 20 are formed over the silicon carbide substrate 10. As will be described later, contact pads for coupling with external circuitry are formed at a later stage in some embodiments. Accordingly, a metallization layer 30 is formed over the silicon carbide substrate 10. The metallization layer 30 may comprise one or more levels of metallization. Each level of metallization may comprise metal lines or vias embedded within an insulating layer. The metallization layer 30 may comprise metal lines and vias to contact the device regions 20 and also to couple different devices within each semiconductor die 1.

Patterned contact pads are formed at the top surface 11 followed by the deposition of a protective layer. The patterned contact pads 31 may be formed by depositing a thick layer of copper using a plating process. An imide layer 32 may be deposited over the thick layer of copper and opened to expose the patterned copper pads 31.

Typically, a passivation layer or protective layer is deposited before further processing. The protective layer is designed to help protect the metallization layer 30 as well as the device regions 20 during subsequent processing. However, in one or more embodiments, the protective layer may be omitted as this function may be advantageously be performed using the etch stop layer.

Figure 2B:
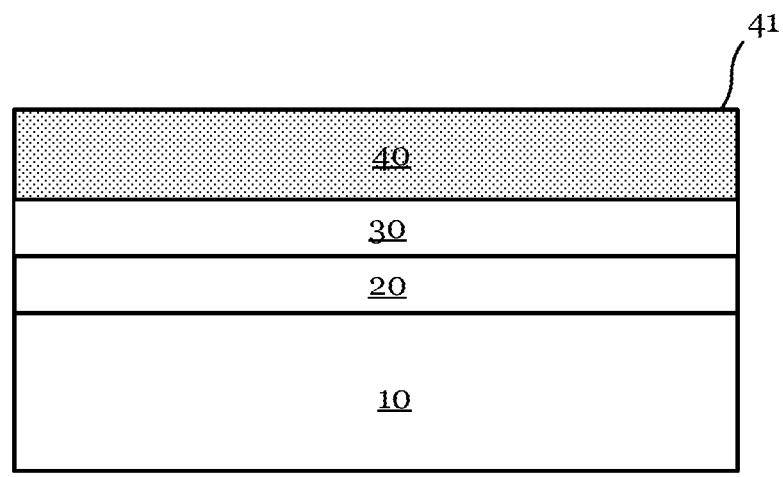
FIG. 2B illustrates a cross-sectional view of a semiconductor device during fabrication after forming an etch stop layer in accordance with an embodiment of the present invention.

FIG. 2B illustrates a cross-sectional view of a semiconductor device during fabrication after forming a etch stop layer in accordance with an embodiment of the present invention.

Referring to FIG. 2B, a etch stop layer 40 is deposited over the top surface 11 of the silicon carbide substrate 10. In various embodiments, the etch stop layer 40 is selected to be an etch stop towards silicon carbide. In one or more embodiments, the etch stop layer 40 comprises a material that etches poorly when exposed to a plasma that etches the silicon carbide substrate 10 very quickly. For example, the silicon carbide substrate 10 may etch at a rate of 5 to 50 microns/minute while the etch stop layer may etch at a rate less than 0.1 microns/minute when exposed to the same chemistry. In one embodiment, the etch stop layer 40 comprises a ceramic material, which may comprise alumina, yttria, aluminium nitride, aluminium oxide, yttrium nitride, yttrium oxide.

In various embodiments, the etch stop layer 40 is deposited using a vapor deposition process, printing, or a coating process. In one or more embodiments, a ceramic paste is deposited over the top surface 11 of the silicon carbide substrate 10. In various embodiments, the ceramic paste is deposited as a liquid using a printing process followed by drying and sintering. In one alternative embodiment, a coating process is used to deposit the ceramic paste. In other embodiments, the ceramic paste may be deposited using processes such as spin on process, for example, during which a spin on dielectric is deposited. In other embodiments, other deposition processes may be used to deposit the paste. In one or more embodiments, in addition to ceramic materials, pastes of e.g., alumina, magnesium oxide, titanium oxide, or similar materials may be printed and sintered to form stable oxides like ceramic pastes or concrete. In various embodiments, the ceramic paste may be a water based mixture and may exhibit self-hardening like concrete. In various embodiments, the ceramic paste has a slurry like viscosity preventing it from flowing away from the silicon carbide substrate 10. In some embodiments, the ceramic paste may be formed by a mixture of two components that set to form a solid material. Additionally in some embodiments, compound materials based on thermally stable polymers filled by organic compounds may also be used. Further embodiments may use powder materials (including ceramics and oxides) that are solidified and/or patterned using laser sintering.

The ceramic paste is sintered (heated) to form a solid material. For example, the sintering may be performed at 380° C. to about 450° C. in one or more embodiments. In another embodiment, sintering is performed at 350° C. to about 450° C. In another embodiment, sintering is performed at 400° C. to about 450° C. In further embodiments, the sintering process may be performed at a lower temperature. After solidification, the etch stop layer may also additionally provide mechanical support and electrical isolation.

In various embodiments, the solidified ceramic paste forms a etch stop layer 40 having a top surface 41 after being subjected to a curing process and a polishing process. After the curing, the solidified ceramic paste may have a curved surface because of the surface tension of the deposited ceramic paste and/or the subsequent stress developed during sintering. A polishing process may be performed to form a planar surface as illustrated. In one or more embodiments, the polishing may be performed using a chemical mechanical process, grinding, wet etching, plasma etching, and others.

In various embodiments, the etch stop layer 40 has a coefficient of thermal expansion similar to that of silicon carbide, for example, $4 \times 10^{-6}$ to $5 \times 10^{-6}$/K. In one or more embodiment, the thickness of the etch stop layer 40 is at least 1 μm. However, in other embodiments, the etch stop layer 40 may be thicker to provide mechanical stabilization and support and therefore may be about 10 μm to about 100 μm in various embodiments. In one or more embodiment, the thickness of the etch stop layer 40 is at least 20% to 70% of the thickness of the final thickness of the silicon carbide substrate 10 (or 20 to 70% of the device region 20).

In various embodiments, the etch stop layer 40 may comprise multiple layers. In one or more embodiments, the etch stop layer 40 may comprise a thin metallic layer such as iron, nickel, and copper that are resistive to etching by the plasma etching chemistry. However, in various embodiments, the etch stop layer 40 is not made purely of metal. This is because the metal atoms would sputter during the subsequent plasma etching and eventually require cleaning or replacement of the wall of the plasma chamber.

Figure 2C:
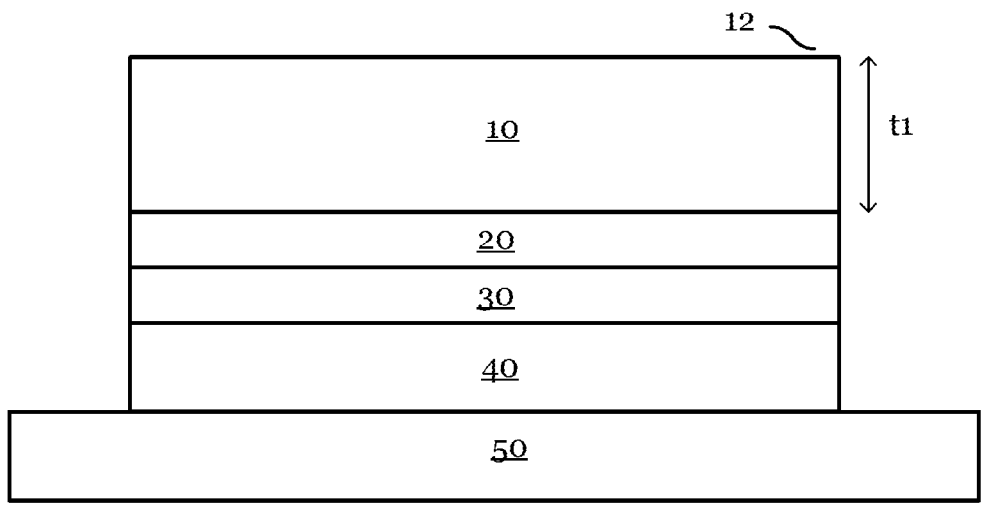
FIG. 2C illustrates a cross-sectional view of the semiconductor device after mounting the device on a carrier in accordance with an embodiment of the present invention.

FIG. 2C illustrates a cross-sectional view of the semiconductor device after mounting the device on a carrier in accordance with an embodiment of the present invention.

Referring to FIG. 2C, the semiconductor device may be mounted on a ceramic carrier 50 for further processing. In some embodiments, if the etch stop layer 40 is sufficiently thick so as to also provide mechanical support during subsequent processing, the ceramic carrier 50 may be skipped. As illustrated in FIG. 2C, the silicon carbide substrate 10 has a first thickness t1 at this stage of processing, which will be reduced for improving the device performance.

Figure 2D:
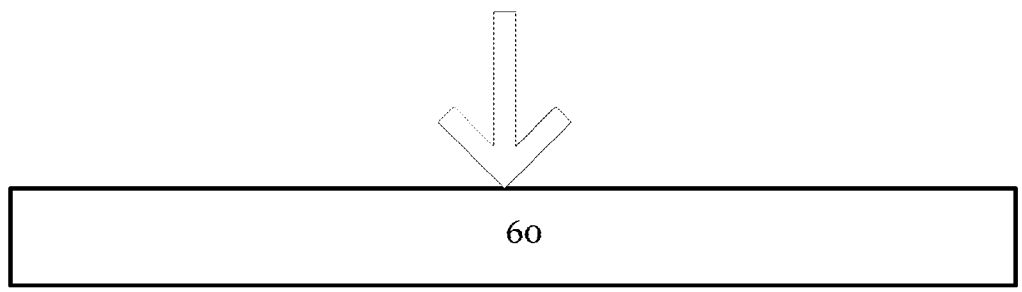
FIG. 2D illustrates a cross-sectional view of the semiconductor device during thinning in accordance with an embodiment of the present invention.
Figure 2D:
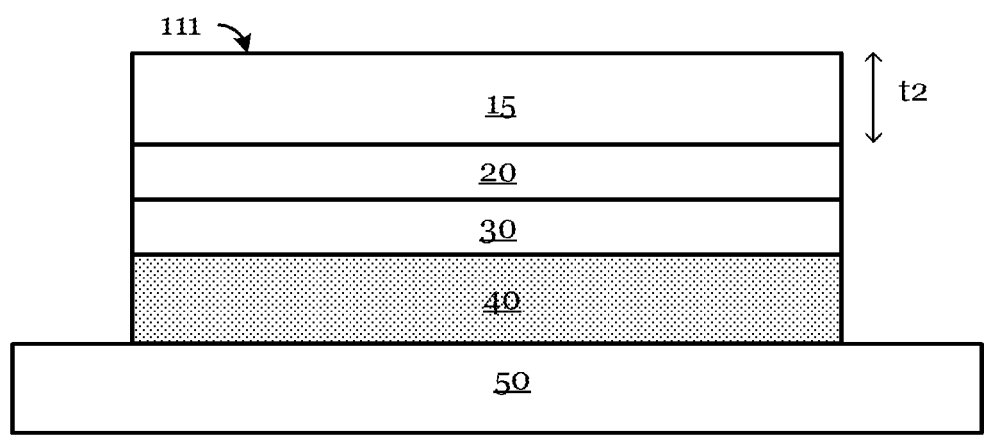

FIG. 2D illustrates a cross-sectional view of the semiconductor device during thinning in accordance with an embodiment of the present invention.

Using the ceramic carrier 50 as a mechanical support, the silicon carbide substrate 10 is thinned from the back side, i.e., from previously bottom surface 12. In various embodiments, the thinning may be performed using a mechanical grinding, chemical etching, or a combination of both. The final depth of the die 1 formed in the silicon carbide substrate 10 will be determined after the thinning. A thinning tool, which may be a grinding tool in one embodiment, reduces the thickness of the silicon carbide substrate 10. In another embodiment, the thinning tool may use a chemical process such as wet etching or plasma etching to thin the silicon carbide substrate 10. In one or more embodiments, the silicon carbide substrate 10 may be thinned without mounting on a tape.

In various embodiments, thinning may be performed globally over the entire wafer backside. In one or more embodiments, second thickness t2 of the silicon carbide substrate 10 after the thinning (i.e., thinned silicon carbide substrate 15) may be 1 μm to about 500 μm. The thinning exposes a new back surface 111 of the thinned silicon carbide substrate 15.

Figure 2E:
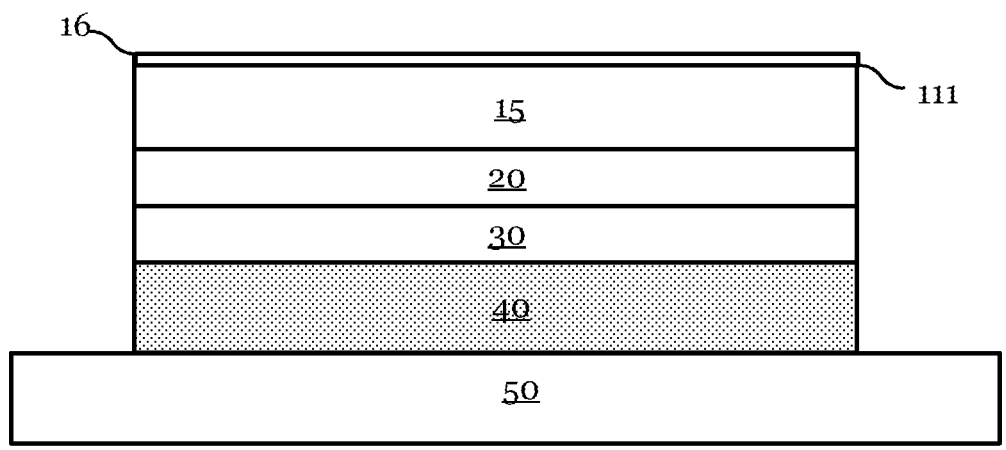
FIG. 2E illustrates a cross-sectional view of a semiconductor device during fabrication after depositing a back side metallization layer after thinning the silicon carbide substrate in accordance with an embodiment of the present invention.

FIG. 2E illustrates a cross-sectional view of a semiconductor device during fabrication after depositing a back side metallization layer after thinning the silicon carbide substrate in accordance with an embodiment of the present invention.

A back side metallization layer 16 may be formed on the exposed back surface 111 of the thinned silicon carbide substrate 15. In various embodiments, the back side metallization layer 16 may comprise more than one metal layer. In one or more embodiments, the back side metallization layer 16 may be deposited using a physical vapor deposition process. In alternative embodiments, the back side metallization layer 16 may be deposited using other vapor deposition processes including chemical vapor deposition, atomic layer deposition, electrochemical deposition, electroless deposition, printing, and others.

In one or more embodiments, the back side metallization layer 16 comprises aluminum. In an alternative embodiment, the back side metallization layer 16 comprises copper. In a further alternative embodiment, the back side metallization layer 16 comprises a solder compatible material, for example, may comprise one or more of silver, tin, gold, platinum, tin, lead, indium, cadmium, bismuth. Specific examples include aluminum layer, titanium layer, nickel vanadium layer, silver, gold-tin, and others for enabling hot aluminum physical vapor deposition for forming low ohmic contacts at the back side of the thinned silicon carbide substrate 15. In yet other embodiments, the back side metallization layer 16 comprises a metal silicide. In another embodiment, the back side metallization layer 16 comprises a metal nitride such as titanium nitride, tungsten nitride, tantalum nitride. In various embodiments, the back side metallization layer 16 may be formed by depositing titanium or tungsten, followed by depositing aluminum.

The back side metallization layer 16 may also include a solder layer for contact formation. Examples of the solder layer include Au, Ag, Sn, Au alloys, Ag alloys, Sn alloys, and combinations thereof. In one embodiment, the solder layer comprises a silver tin alloy. In various embodiments, the solder layer may include multiple layers that form a solder layer, and may also protect the underlying metals from the environment. In some embodiments, copper may be used as the solder layer.

Figure 2F:
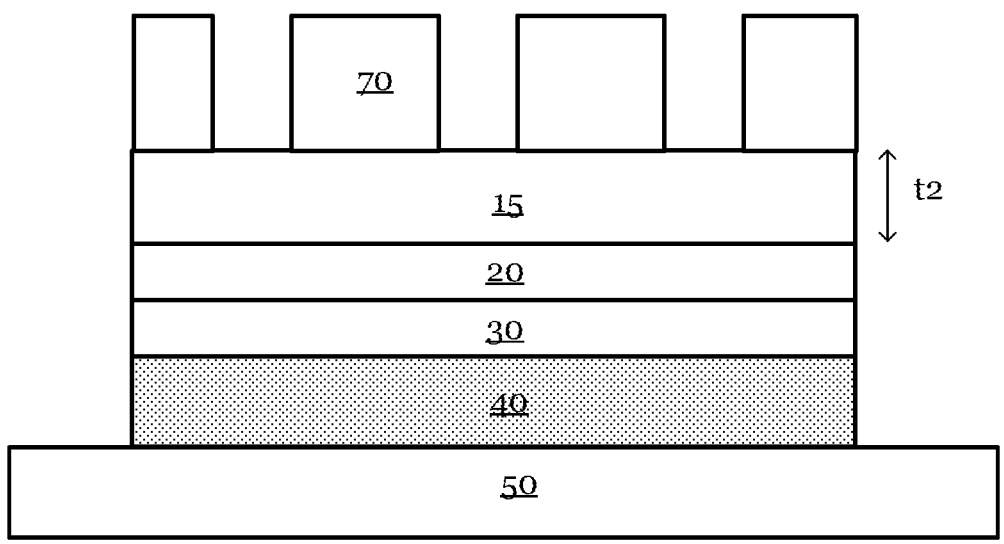
FIG. 2F illustrates a cross-sectional view of a semiconductor device during fabrication after forming a patterned hard mask layer in accordance with an embodiment of the present invention.

FIG. 2F illustrates a cross-sectional view of a semiconductor device during fabrication after forming a patterned hard mask layer in accordance with an embodiment of the present invention.

A patterned hard mask layer 70 is formed as illustrated in FIG. 2F. In one embodiment, a blanket layer of a hard mask is deposited and patterned. The hard mask may include multiple layers such as e.g. Ni, Al, carbon, silicon oxide, silicon nitride, titanium nitride, and others.

In various embodiments, the material of the hard mask layer 70 is selected so that it etches slower than the thinned silicon carbide substrate 15. In particular, the thickness of the hard mask layer 70 is selected for a given etch rate so that the hard mask layer 70 is not completely etched during the time it takes to etch through the thinned silicon carbide substrate 15.

The hard mask layer 70 may be deposited using a vapor deposition process such as chemical vapor deposition (CVD), physical vapor deposition, plasma enhanced CVD, including atmospheric pressure chemical vapor deposition (APCVD) or sub-atmospheric pressure chemical vapor deposition (SACVD), spin-on processes, and others.

The hard mask layer 70 may be patterned using a lithography process. For example, a layer of photosensitive material is deposited over the hard mask layer 70. The layer of photosensitive material is patterned by exposure to light or radiation to transfer a pattern from a lithography mask (not shown) to the layer of photosensitive material, and the photosensitive material is developed. The layer of photosensitive material is then used as an etch mask while portions of the hard mask layer 70 are etched away, leaving the illustrated patterned structure.

Figure 2G:
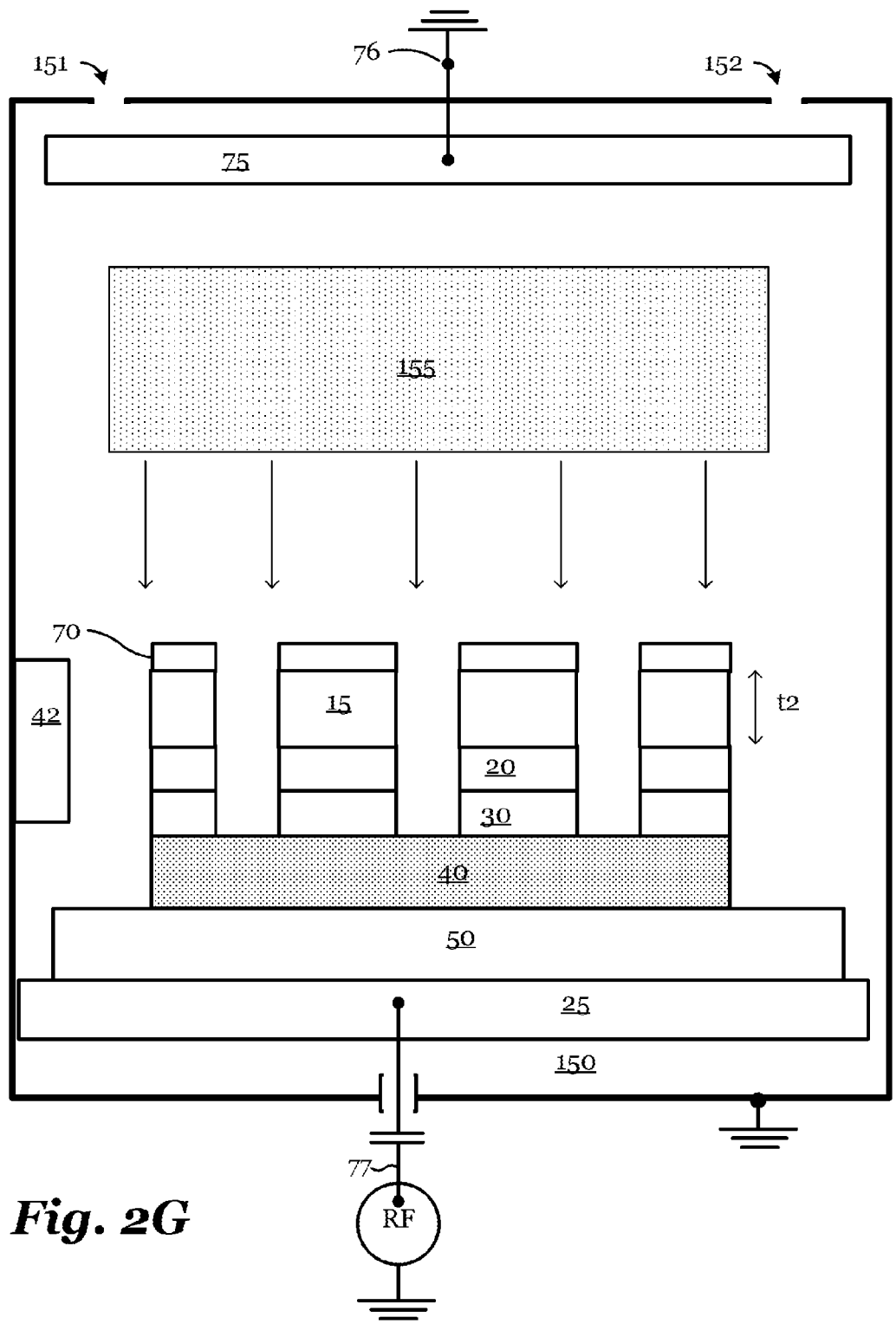
FIG. 2G illustrates a cross-sectional view of a semiconductor device during fabrication in a plasma tool during a plasma dicing process in accordance with an embodiment of the present invention.

FIG. 2G illustrates a cross-sectional view of a semiconductor device during fabrication after forming a patterned hard mask layer in accordance with an embodiment of the present invention.

Using the patterned hard mask layer 70 as an etch mask, the thinned silicon carbide substrate 15 is plasma etched using a plasma process. The walls of the plasma chamber 150 are lined with an inert material such as quartz. The device to be etched is placed within the plasma chamber 150 over the chuck 25.

In various embodiments, the thinned silicon carbide substrate 15, the plasma etching rate is increased by using a high temperature process. Accordingly, in various embodiments, the thinned silicon carbide substrate 15 is heated to about 300° C. or even higher. In one embodiment, the thinned silicon carbide substrate 15 is heated to 500° C. to 700° C. This may be accomplished by heating the wafer, for example, by a lamp 42. The lamp 42 may be an arc lamp, infrared lamp, or a flash lamp, to rapidly heat the wafer. The lamp 42 may be outside the plasma wall and accessible through a window in the plasma wall in one embodiment. Alternatively, the chuck 25 may also be heated separately or in combination with the lamp 42. A rapid thermal annealing lamp may be used to heat the wafer quickly. For example, the thinned silicon carbide substrate 15 may heated within 10 s to 20 s. Once the thinned silicon carbide substrate 15 reaches the holding temperature, the plasma process is initiated.

In various embodiments, the temperature of the thinned silicon carbide substrate 15 is controlled carefully to avoid exceeding the allowable limit for the metallization. For example, if the front side metallization comprises aluminium lines, then the temperature is below 450 C to avoid damage to the aluminium metal lines.

However, before initiating the plasma process, the surfaces of the device and the plasma chamber have to be cleaned to remove any potential gases that will result in an explosion. This is because the plasma etching is to be performed using chlorine trifluoride (and similar gases), which is a very combustible and explosive component. Chlorine trifluoride is an oxidising gas and is extremely reactive. It reacts with almost all substances including silicon oxide, silicon nitride, and almost all materials used in the semiconductor fabrication. For example, even trace amounts of water can cause an explosion.

Accordingly, inert gases such as nitrogen and/or argon may be used for the purging. In one embodiment, the purging may be performed before heating the thinned silicon carbide substrate 15. In another embodiment, the purging may be performed after heating the thinned silicon carbide substrate 15. Accordingly, during or after the heating process, a purge process may be performed to clean the surface of the thinned silicon carbide substrate 15 and remove any explosive gases from the plasma chamber 150.

Next, the plasma is generated inside the plasma chamber 150. Plasma etch systems may be designed to be either reactive or ionic, and are typically a combination of both. The net etch rate of the plasma etching process may be higher than the individual etch rates obtainable using a reactive wet etching or a physical etching process. Accordingly, the plasma system may be a plasma etching system such as a barrel reactor, downstream plasma etcher, parallel plate etch system running in a plasma mode or in a reaction ion etch mode, or a high density plasma etch system. In one or more embodiments, anisotropic etching methods such as the reactive ion etching and high density plasma etching are used.

Accordingly, the plasma may be generated using different types of plasma reactors in various embodiments. In one embodiment, the plasma tool may be a microwave generator, an electron-cyclotron resonance (ECR) plasma reactor, an inductively coupled plasma reactor, a remote plasma reactor, a helicon plasma reactor, and others. Additionally remote plasma generated by a microwave plasma generation unit may be used in some embodiments. In one or more embodiments, the plasma tool generates high density plasma.

The plasma etching process is performed in a plasma chamber 150 comprising one or more inlets 151 and one or more outlets 152. The plasma chemistry is controlled by a flow of gasses through the chamber from the inlets 151 to the outlets 152. The thinned silicon carbide substrate 15 with the etch stop layer 40 is placed on a chuck 25. The carrier 50 and the etch stop layer 40 may be also electrically conductive for providing improved etch anisotropicity and to provide a more uniform electric field around the thinned silicon carbide substrate 15 in some embodiments. In some embodiments, the carrier 50 may be skipped and therefore the etch stop layer 40 is placed directly on the chuck 25.

The plasma may be generated by applying power between the top electrode node 76 and the bottom electrode node 77. The plasma chamber 150 is grounded during operation. The bottom electrode node 77 couples the RF generator to the chuck 25 through a blocking capacitor. The plasma may be generated by powering the plasma chamber 150 from about 0.1 W/cm$^2$ to about 10 W/cm$^2$ in one embodiment. In one embodiment, the plasma is powered with a RF power at 13.56 MHz with excitation RMS voltages of 100 V to 2000 V. In various embodiments, in a plasma etching system, a high electric field is applied between the top electrode 75 and the thinned silicon carbide substrate 15, which ionizes some of the gas atoms within the plasma chamber 150 to form a plasma 155. A voltage bias is developed between the plasma 155 and the top electrode 75 and the thinned silicon carbide substrate 15. The charged ions, as well as neutral chemical radicals, may be accelerated and directed towards the thinned silicon carbide substrate 15 resulting in etching.

The plasma chemistry may comprise an etchant gas and an inert gas in various embodiments. In various embodiments, the etchant gas is selected to be chlorine trifluoride or other interhalogen compounds such as chlorine fluoride, chlorine pentafluoride. An additional reactant gas may be used if a compound of chlorine trifluoride is used. The flow rate of chlorine trifluoride is about 100 sccm to about 500 sccm. The pressure inside the plasma chamber 150 may be about 1 mtorr to 1 torr.

As described above, some of the chlorine trifluoride is ionized and accelerated towards the exposed back surface of the thinned silicon carbide substrate 15 due to the potential difference between the chuck 25 and the plasma chamber iso. The hard mask layer 70 exposes only the dicing regions of the thinned silicon carbide substrate 15 so that the etching proceeds along the dicing plane through the thinned silicon carbide substrate 15.

The ionized species and the neutral species together rapidly etch through the thinned silicon carbide substrate 15. The directional etching provided by the ionized species results in vertical sidewalls. Because of the extremely reactive nature of the chlorine trifluoride, etch rates greater than 10 microns/minute are easily achieved resulting in excellent throughput. In various embodiments, the etch rates through the thinned silicon carbide substrate 15 may be between 10 microns/minute to 30 microns/minute.

Additionally, because of the explosive and corrosive nature of the interhalogen gases used in the plasma chamber 150, the walls of the plasma chamber 150 are lined with inert materials such as alumina, yttria, or other ceramics or quartz to minimize/avoid the etching of the walls of the plasma chamber 150.

The etch stop layer 40 is specifically designed to stop the plasma etching process. Without the etch stop layer 40, the individual dies will scatter within the plasma chamber 150 once the plasma etching proceeds etching through the thinned silicon carbide substrate 15 separating the dies. The etch stop layer 40 is relatively inert to the plasma chemistry and does not etch and therefore helps to hold the dies together. The plasma etch may be a timed etch or may be stopped when the material of the etch stop layer 40 is observed.

Silicon carbide is very difficult to plasma etch and conventional plasma etch rates are less than 1 microns/minute. Using embodiments of the present invention, etch rates that are many times higher achievable using conventional plasma etching may be possible.

Embodiments of the present invention may be used in a remote plasma system, the plasma generation process described in various embodiments above may be used to generate plasma, which is then transferred to a different chamber. The reactive chemical species and/or ions from the plasma source may then be used in the dicing step in the adjacent chamber. For example, the chemical species can diffuse into another chamber where it interacts with the wafers. Alternatively, the ionic species may be accelerated downwards and used.

Figure 2H:
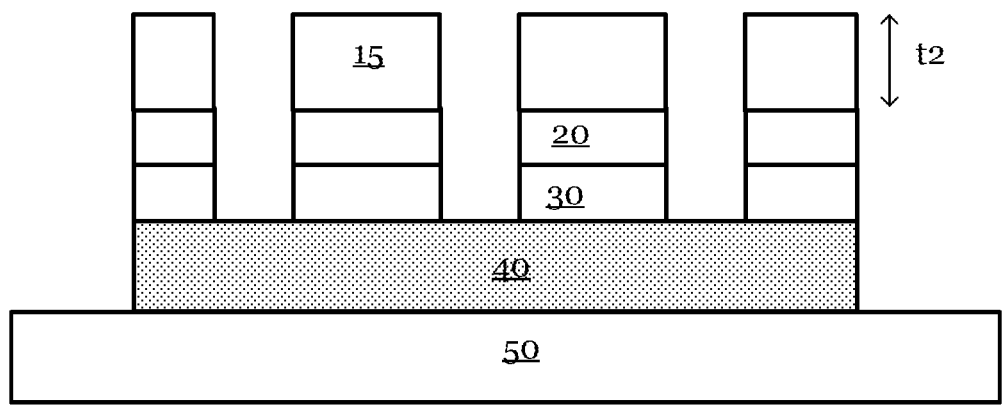
FIG. 2H illustrates a cross-sectional view of a semiconductor device during fabrication after removing any remaining hard mask layer in accordance with an embodiment of the present invention.

FIG. 2H illustrates a cross-sectional view of a semiconductor device during fabrication after removing any remaining hard mask layer in accordance with an embodiment of the present invention.

Unlike the etch stop layer 40, the hard mask layer 70 is significantly etched during the plasma exposure. In some embodiments, only a small thickness of the hard mask layer 70 may be present after the plasma etching as illustrated in the previous figure. This remaining hard mask layer is removed to expose the surface of the thinned silicon carbide substrate 15.

Figure 2I:
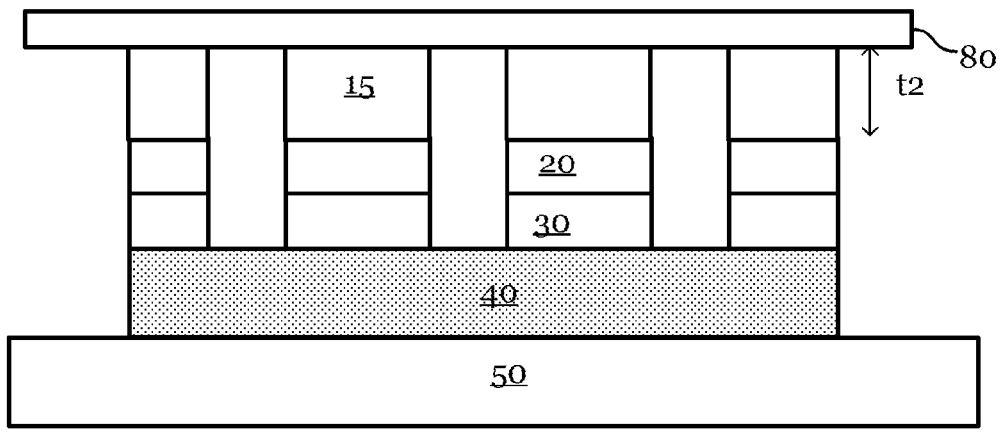
FIG. 2I illustrates a cross-sectional view of a semiconductor device during fabrication after attaching a tape and frame in accordance with an embodiment of the present invention.

FIG. 2I illustrates a cross-sectional view of a semiconductor device during fabrication after attaching a tape in accordance with an embodiment of the present invention.

The thinned silicon carbide substrate 15 may be mounted to a frame 80 comprising an adhesive tape. The thinned silicon carbide substrate 15 is attached to the adhesive tape within the outer frame. The frame, which is an annular structure, supports the adhesive tape along the outer edges in one or more embodiments. The adhesive tape may be a dicing tape in one embodiment. In another embodiment, the adhesive tape may have a substrate, e.g., polyvinyl chloride, with the coating of an adhesive layer such as an acrylic resin. In one or more embodiments, the frame 80 comprises a supporting material such as a metal or plastic (ceramic) material. In various embodiments, the inside diameter of the frame 80 is greater than the diameter of the thinned silicon carbide substrate 15.

Figure 2J:
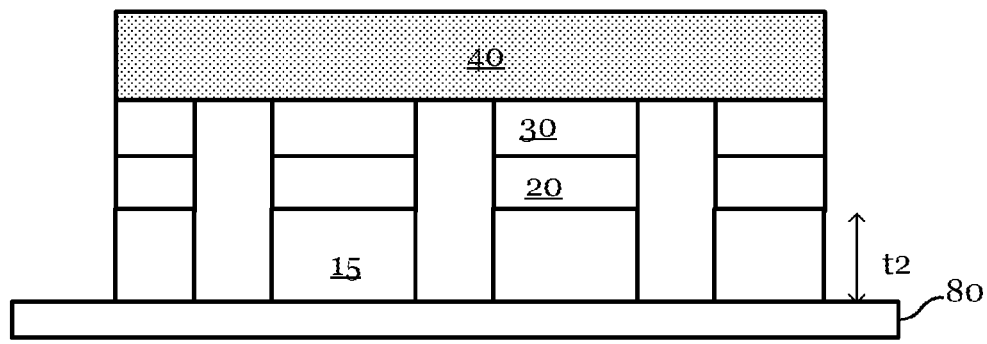
FIG. 2J illustrates a cross-sectional view of a semiconductor device during fabrication after removing from the carrier accordance with an embodiment of the present invention.

FIG. 2J illustrates a cross-sectional view of a semiconductor device during fabrication after removing from the carrier accordance with an embodiment of the present invention.

FIG. 2J illustrates the device after separating from the carrier 50 and flipping the substrate. The thinned silicon carbide substrate 15 with the etch stop layer 40 attached to the frame 80 is separated from the carrier 50. The carrier 50 may be separated by using a chemical process, a heating process, a mechanical process, or a combination of the above.

Figure 2K:
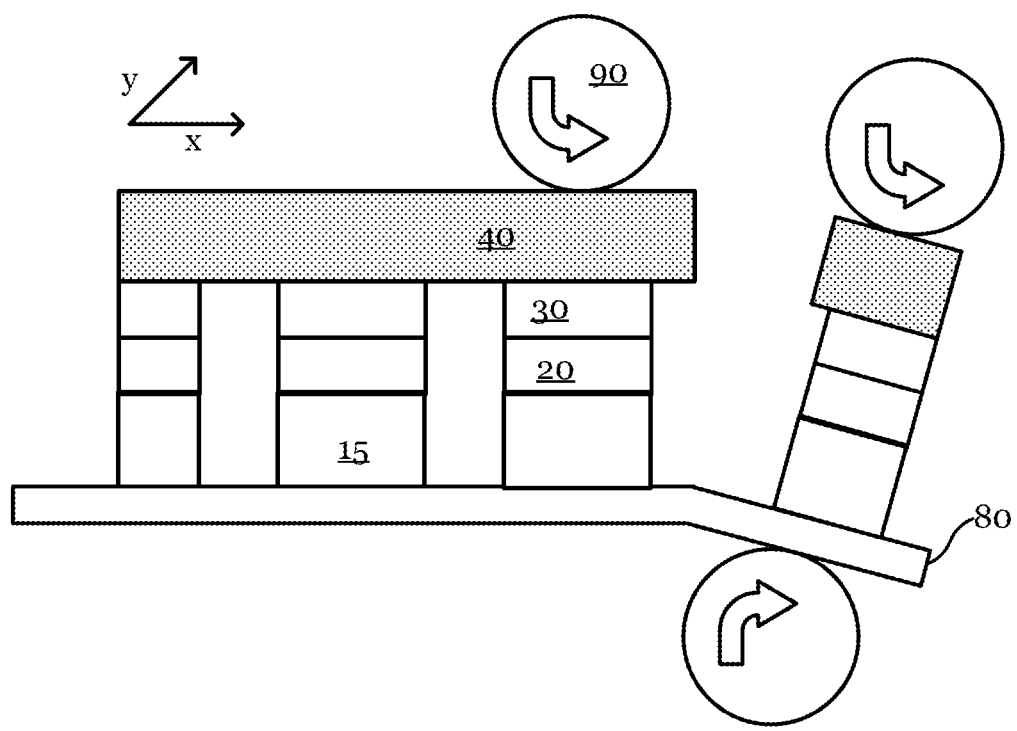
FIG. 2K illustrates a cross-sectional view of a semiconductor device during fabrication after completing the dicing process accordance with an embodiment of the present invention.

FIG. 2K illustrates a cross-sectional view of a semiconductor device during fabrication after completing the dicing process accordance with an embodiment of the present invention.

The next step in the dicing process is the dicing of the etch stop layer 40 that holds the different chips together. The thinned silicon carbide substrate 15 that has now been plasma diced is separated into individual chips. In one embodiment, a mechanical separation process is used to apply pressure on the etch stop layer 40.

As illustrated in FIG. 2K, the etch stop layer 40 is diced mechanically by applying pressure through the rollers 90. For example, repeated mechanical force in the x-y plane may be provided using the rollers 90 resulting in the cleavage of the etch stop layer 40. The mechanical forces initiates a crack that propagates through the etch stop layer 40. Accordingly, the sidewall surface of the etch stop layer 40 comprises a cleaved surface that may have a higher surface roughness than the sidewall of the thinned silicon carbide substrate 15 that has been plasma diced.

Figure 3:
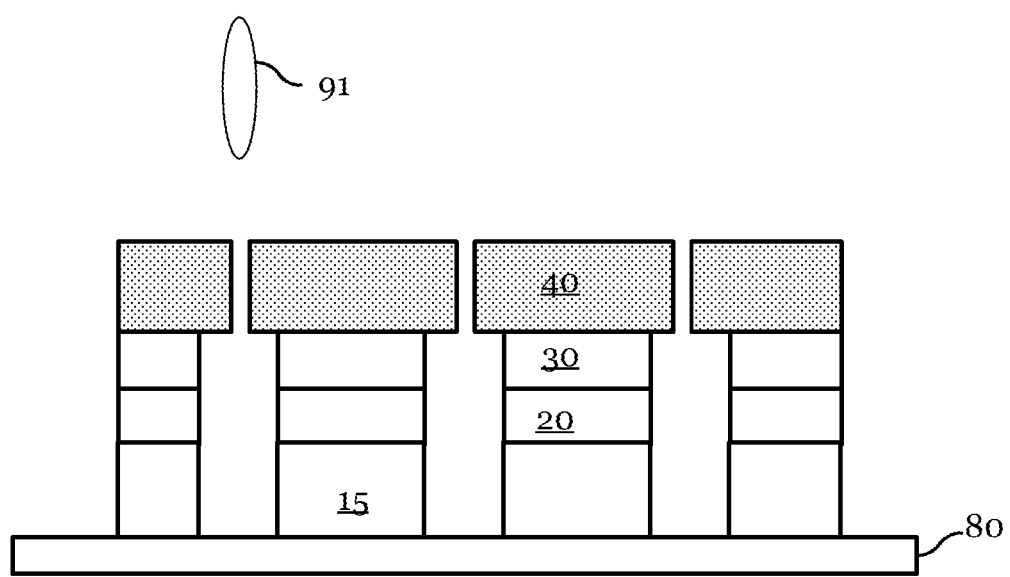
FIG. 3 illustrates a cross-sectional view of a semiconductor device during fabrication using an alternative way of dividing the thinned silicon carbide substrate in accordance with an embodiment of the present invention.

FIG. 3 illustrates a cross-sectional view of a semiconductor device during fabrication after an alternative way of separation in accordance with an embodiment of the present invention.

Referring to FIG. 3, the etch stop layer 40 may be diced using a sawing blade 91 in one embodiment. In an alternative embodiment, the etch stop layer 40 may be diced using a laser process such as stealth dicing.

FIGS. 4A-4E illustrates sectional views of a semiconductor device during various stages of fabrication in accordance with an embodiment of the present invention.

In one or more embodiments, the contact pads at the front side of the device have to be exposed. In one or more embodiments, the contact pads are exposed after the plasma dicing so as to prevent etching the contact pads. Accordingly, the contact pads are formed and covered with the etch stop layer. After the plasma dicing of the thinned silicon carbide substrate, the etch stop layer is patterned to expose the contact pads. Advantageously, the patterning of the etch stop layer is performed while the individual dies remain attached together in a wafer form. Forming the openings in the etch stop layer after complete separation can be costly.

Figure 4A:
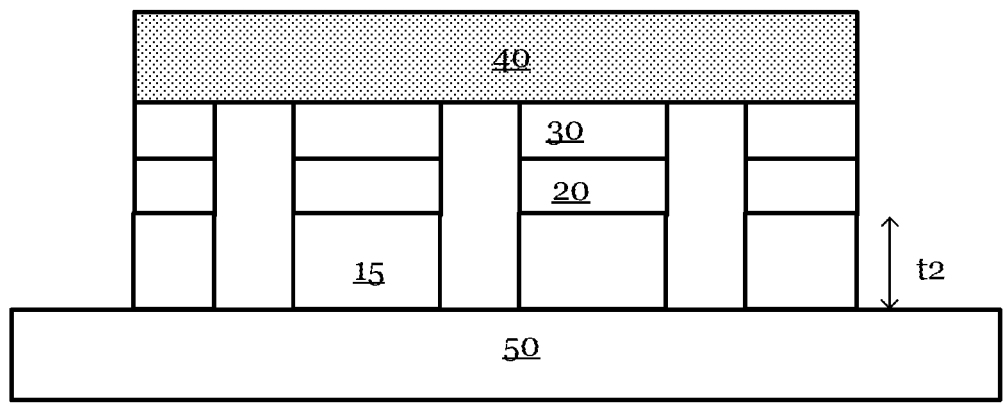
FIGS. 4A-4E illustrates sectional views of a semiconductor device during various stages of fabrication in accordance with an alternative embodiment of the present invention.

The embodiment described in FIGS. 4A-4E illustrates one way of opening the contacts. The embodiment described in FIG. 2 is combined with the embodiment described in FIGS. 4A-4E. For example, FIG. 4A illustrates the device after forming a etch stop layer 40 (e.g., as described in FIGS. 2A-2F) and after plasma dicing (e.g., as described in FIG. 2G-2H).

Figure 4B:
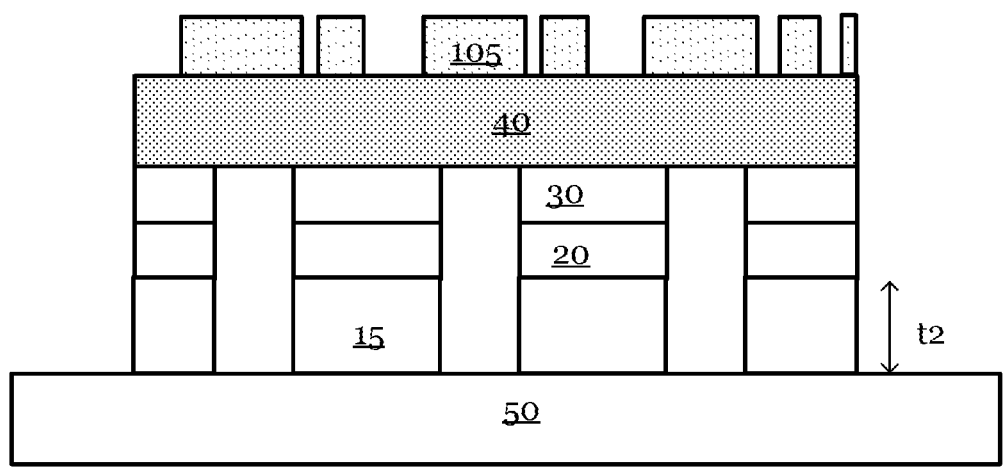

The wafer 51 is placed on a carrier 50 for processing as illustrated in FIG. 4A. Referring to FIG. 4B, a resist layer 105 is formed and patterned, for example, using conventional lithography processes. The resist layer 105 is patterned for contacting the devices in the device region 20 within the thinned silicon carbide substrate 15 through the metallization layer 30

Figure 4C:
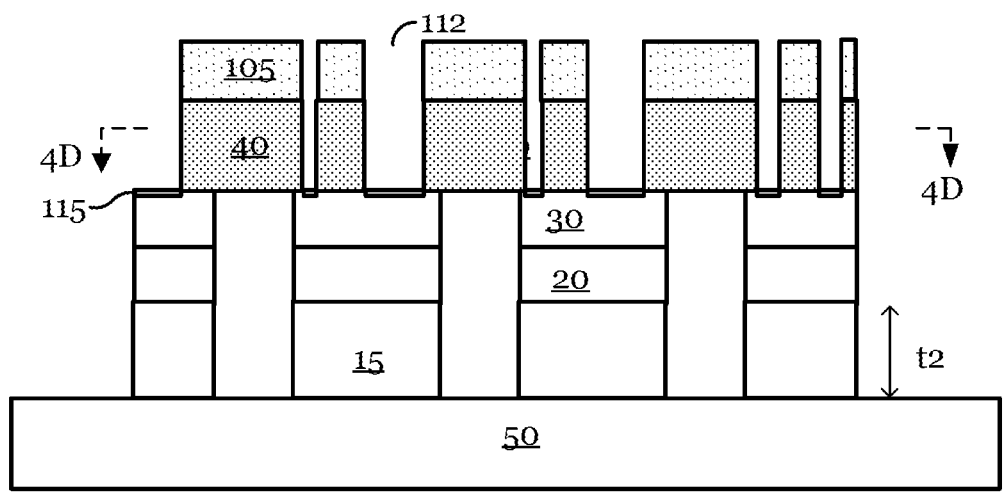
Figure 4D:
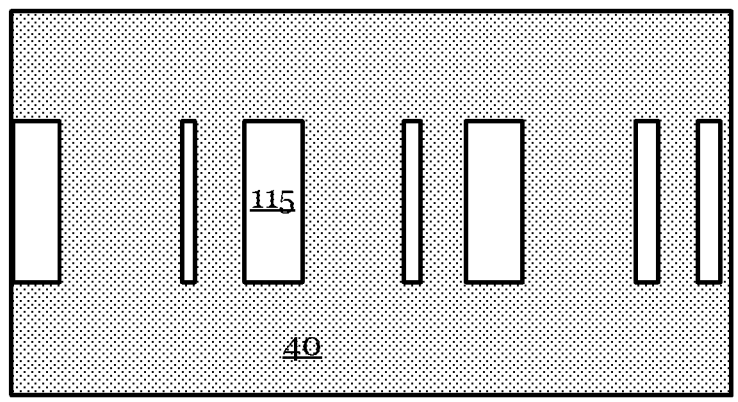
Figure 4E:
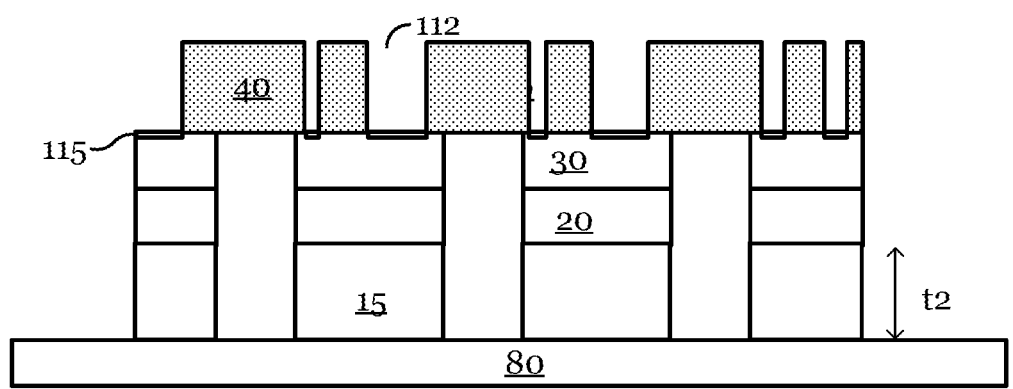

Using the patterned resist layer 105, the underlying etch stop layer 40 is etched to form openings 112. In various embodiments, the etching is performed using an anisotropic etching process such as a reactive ion etching process. The contact pads 115 at the upper most level of the metallization layer 30 are opened by the etching process as illustrated in FIGS. 4C and 4D. FIG. 4C is a cross-sectional view and FIG. 4D is a top sectional view illustrating the contact pads in the metallization layer 30. After exposing the contact pads 115, the patterned resist layer 105 (if remaining) is removed as next illustrated in FIG. 4E.

Figure 5A:
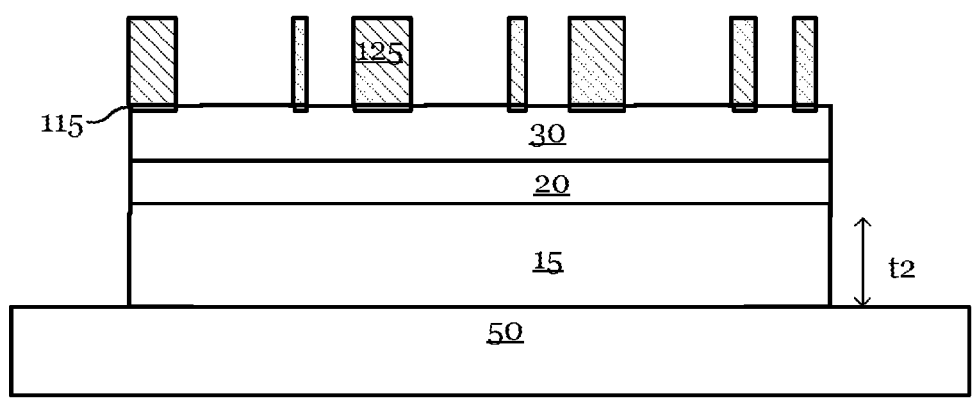
FIGS. 5A-5B illustrates cross-sectional view of a semiconductor device during various stages of fabrication in accordance with an alternative embodiment of the present invention.
Figure 5B:
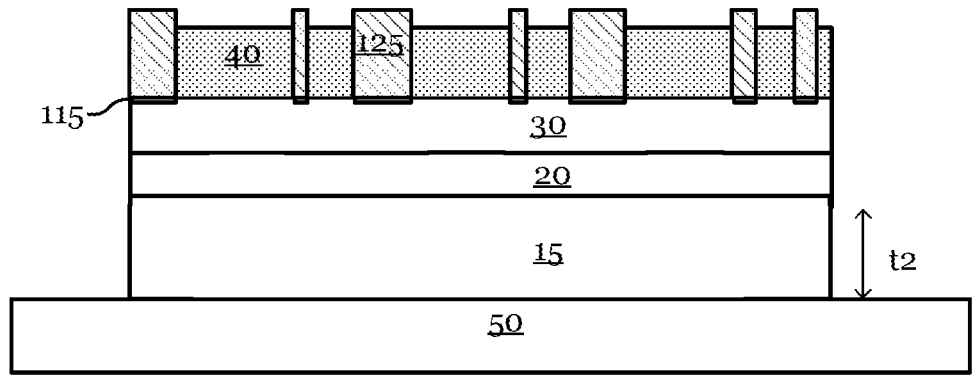

FIGS. 5A-5B illustrates cross-sectional view of a semiconductor device during various stages of fabrication in accordance with an embodiment of the present invention.

This embodiment illustrates an alternative way of exposing the pre-formed contact pads. In this embodiment, the contact opening is prefabricated and filled with a sacrificial material. Referring to FIG. 5A, a sacrificial resist layer 125 may be formed and patterned to cover the contact pads before depositing the etch stop layer 40. The sacrificial resist layer 125 comprises a sacrificial material that also has a different etch immunity towards the plasma etch chemistry. For example, the sacrificial material of the sacrificial resist layer 125 does not etch when subjected to chlorine trifluoride. Additionally, the sacrificial material has a different material than the etch stop layer 40 that is subsequently deposited. Because of this difference, the sacrificial material can be removed selectively after the plasma dicing.

As next illustrated in FIG. 5A, the etch stop layer 40 is deposited within the openings between the sacrificial resist layer 125. In various embodiments of the present invention, the sacrificial resist layer 125 may have a different thickness than the sacrificial resist layer 125. For example, the sacrificial resist layer 125 may have a faster etch rate when exposed to the plasma. However, as long as the sacrificial resist layer 125 is not fully removed during the plasma process, there is no damage to the underlying contact pads 115.

Figure 6A:
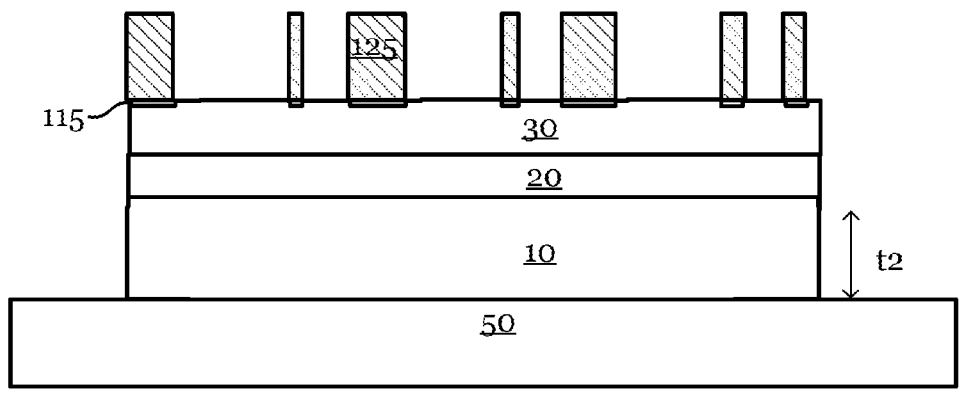
FIGS. 6A-6D illustrates cross-sectional views of a semiconductor device during various stages of fabrication while forming an patterned etch stop layer in accordance with an embodiment of the present invention.
Figure 6B:
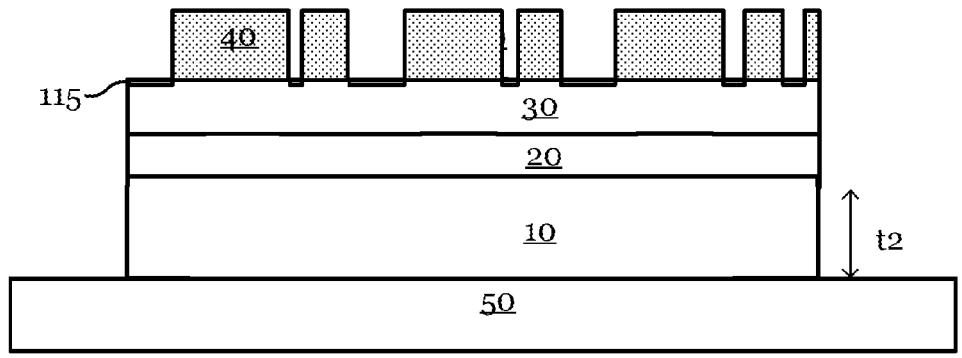

FIGS. 6A-6B illustrates cross-sectional views of a semiconductor device during various stages of fabrication while forming an patterned etch stop layer in accordance with an embodiment of the present invention.

In further embodiments, a patterned etch stop layer may be deposited. For example, the patterned etch stop layer may be deposited between a sacrificial resist layer 125 (FIG. 6A), and the sacrificial resist layer 125 is removed after depositing the etch stop layer 40 (FIG. 6B) so as to expose the contact pads. Alternatively, a patterned etch stop layer having the openings for the contacts may be deposited in a single step using stencil printing.

Figure 6C:
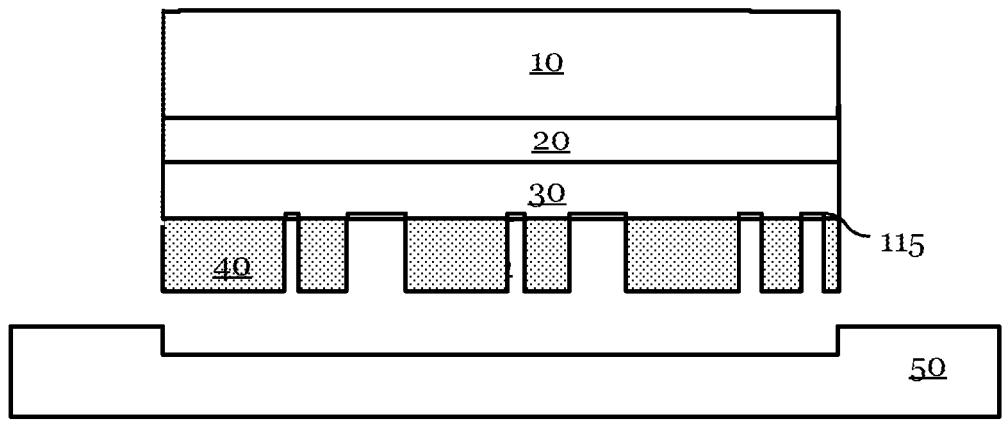

Referring to FIG. 6C, the front side of the substrate 10 is mounted on a carrier such as a carrier 50. In one embodiment, the carrier 50 comprises a recess. The carrier 50 may comprise a silicon wafer with a recess in one embodiment.

Figure 6D:
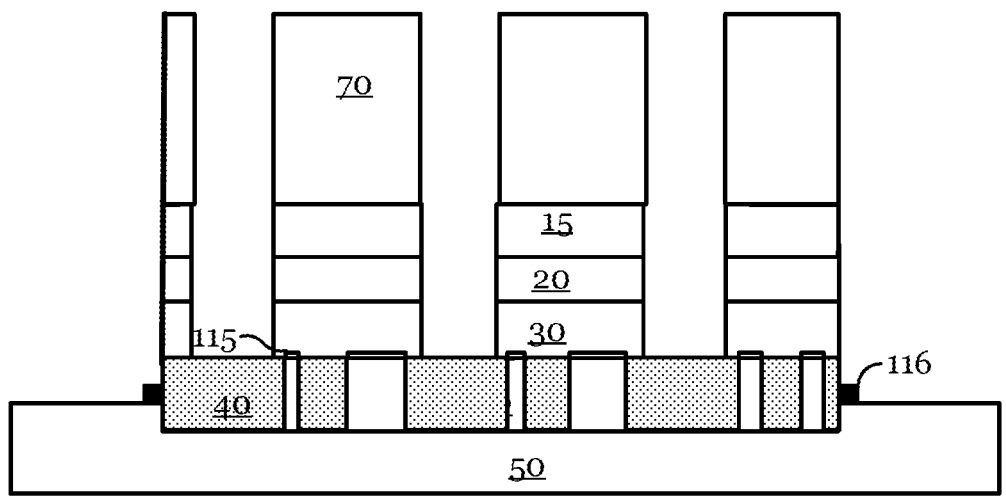

Referring to FIG. 6D, after thinning the substrate 10 from the back side and attaching to the carrier 50, a patterned hard mask layer 70 is formed for plasma dicing as described in prior embodiment.

The contact openings in the etch stop layer 40 may be covered during further processing by a high temperature glue, an O-ring (seal) immune to high-temperature, and others. For example, in one embodiment, the carrier 50 may comprise a recess in which the thinned silicon substrate 15 may fit. The sidewalls touching the carrier 50 may be filled with a high temperature glue to form a seal that prevents the etchant from attacking the contact pads exposed through the contact openings. Examples of sealing layer include a high temperature circular O-ring 116 around the etch stop layer 40.

The thinned silicon carbide substrate 15 is plasma diced in the plasma tool (similar to FIG. 2G).

Figure 7A:
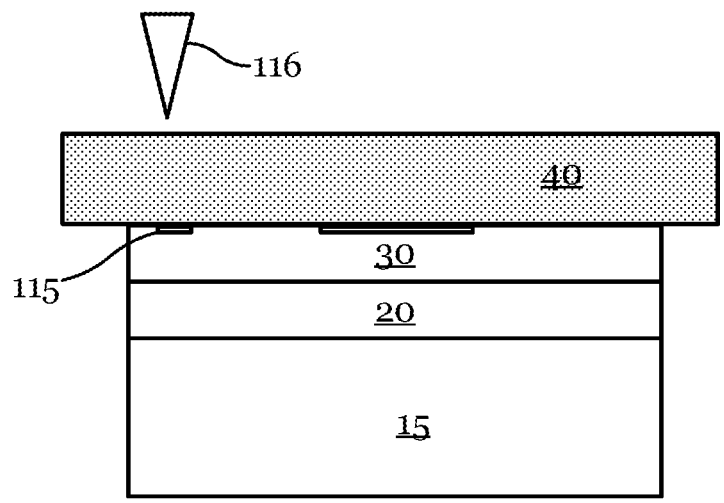
FIGS. 7A-7B illustrates cross-sectional views of a semiconductor device during various stages of fabrication and illustrates contact formation by local laser drilling of individual dies in accordance with an embodiment of the present invention.
Figure 7B:
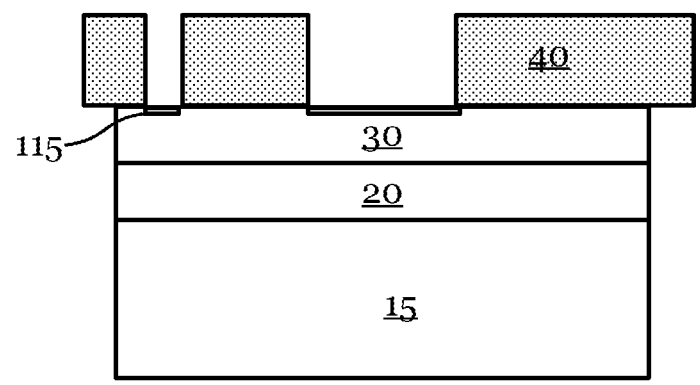

FIGS. 7A-7B illustrates cross-sectional views of a semiconductor device during various stages of fabrication and illustrates contact formation by local laser drilling of individual dies in accordance with an embodiment of the present invention.

In alternative embodiments, the processing of the dies may proceed as described in prior embodiments such as FIG. 2A-2K, or 3, to produce a plurality of separated dies. However, contact pad openings are not formed prior to dicing. Therefore, the diced dies do not have exposed contact pads. Accordingly, each individual die is processed individually and the contact pads are opened, for example, using a laser drilling process. Accordingly, FIG. 7A illustrates a cross-sectional view of the semiconductor die during laser drilling but the laser tip 116 that focusses a laser beam onto the etch stop layer 40. FIG. 7B illustrates a cross-sectional view of the semiconductor die after the laser drilling.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:
   forming an active region in a first side of a silicon carbide substrate, the silicon carbide substrate comprising a second side opposite the first side;
   forming a contact pad at the first side of the silicon carbide substrate, the contact pad being coupled to the active region;
   after forming the contact pad, forming an etch stop layer over the contact pad;
   plasma dicing the silicon carbide substrate from the second side, the plasma dicing etching through the silicon carbide substrate and stopping on the etch stop layer, the diced silicon carbide substrate being held together by the etch stop layer;
   attaching the diced silicon carbide substrate on a carrier;
   from the first side, forming a contact opening in the etch stop layer after the plasma dicing, the contact opening exposing the contact pad formed at the first side of the silicon carbide substrate; and
   after exposing the contact pad, separating the diced silicon carbide substrate into silicon carbide dies by cleaving the etch stop layer.

2. The method of claim 1, wherein the plasma dicing comprises an etch chemistry that selectively etches the silicon carbide substrate relative to the etch stop layer.

3. The method of claim 1, wherein, during the plasma dicing, an etch rate of the silicon carbide substrate when exposed to the plasma of the plasma dicing is between 10 µm/minute to 30 µm/minute.

4. The method of claim 3, wherein an etch rate of the etch stop layer when exposed to the plasma of the plasma dicing is between 0.01 µm/minute to 0.1 µm/minute.

5. The method of claim 1, wherein cleaving the etch stop layer comprises separation by mechanical force.

6. The method of claim 1, wherein cleaving the etch stop layer comprises sawing the etch stop layer or stealth dicing the etch stop layer.

7. The method of claim 1, wherein forming an etch stop layer over the contact pad comprises coating a liquid layer over the silicon carbide substrate, curing the liquid layer, and polishing the cured liquid layer to form a planar surface.

8. The method of claim 1, wherein forming an etch stop layer over the contact pad comprises stencil printing the etch stop layer, the contact pad remains open after the stencil printing.

9. The method of claim 1, wherein the carrier comprises a frame with a tape.

10. The method of claim 1, wherein the silicon carbide substrate comprises a first major surface at the first side and a second major surface at the second side, wherein the silicon carbide substrate is a monocrystalline material, and wherein the first major surface is a (100) crystal plane surface.

11. The method of claim 1, further comprising:
    grinding the silicon carbide substrate from the second side before the plasma dicing.

12. The method of claim 1, wherein the etch stop layer comprises a ceramic material.

13. The method of claim 1, wherein the plasma dicing using a plasma etching tool comprising:
    a plasma chamber;
    an inlet for an inter-halogen gas;
    an outlet for the inter-halogen gas;
    electrodes for generating a plasma from the inter-halogen gas; and
    a heating unit for heating a wafer to be etched using the plasma.

14. The method of claim 1, the etch stop layer comprising alumina, yttria, aluminium nitride, aluminium oxide, yttrium nitride, or yttrium oxide.

15. A method of forming a power semiconductor device, the method comprising:
    providing a silicon carbide substrate comprising a first side and a second side opposite the first side;
    doping a portion of the silicon carbide substrate to form an active region from the first side;
    forming a contact pad at the first side of the silicon carbide substrate, the contact pad being coupled to the active region;
    forming a patterned protective layer covering the contact pad;
    forming a ceramic stabilization layer over the active region and the contact pad, the ceramic stabilization layer configured to provide mechanical stabilization and support, the ceramic stabilization layer disposed between adjacent regions of the patterned protective layer;
    from the second side, thinning the silicon carbide substrate to expose a major surface;
    forming a patterned mask layer under the exposed major surface of the silicon carbide substrate;
    placing the silicon carbide substrate with the patterned mask layer within a plasma chamber and heating the silicon carbide substrate to a temperature greater than 300° C.;
    using an etch chemistry comprising an interhalogen compound comprising chlorine and fluorine and the patterned mask layer as an etch mask, etching through the silicon carbide substrate to expose the ceramic stabilization layer; and
    removing the patterned protective layer after the etching.

16. The method of claim 15, wherein the interhalogen compound is chlorine tetrafluoride.

17. The method of claim 15, wherein the etch chemistry selectively etches the silicon carbide substrate relative to the ceramic stabilization layer.

18. The method of claim 15, further comprising:
    after the etching, attaching a flexible carrier to the exposed major surface of the silicon carbide substrate; and
    cleaving the ceramic stabilization layer to form a plurality of silicon carbide dies, wherein each of the plurality of silicon carbide dies comprising a portion of the ceramic stabilization layer and a portion of the silicon carbide substrate.

19. The method of claim 18, wherein cleaving the ceramic stabilization layer comprises separation by mechanical force.

20. The method of claim 18, wherein cleaving the ceramic stabilization layer comprises sawing the ceramic stabilization layer or stealth dicing the ceramic stabilization layer.

21. The method of claim 15, wherein the etching is performed in a plasma etching tool comprising:
    a plasma chamber;
    an inlet for an inter-halogen gas;

an outlet for the inter-halogen gas;
electrodes for generating a plasma from the inter-halogen gas; and
a heating unit for heating a wafer to be etched using the plasma.

22. A method of forming a power semiconductor device, the method comprising:
providing a silicon carbide substrate comprising a first side and a second side opposite the first side;
doping a portion of the silicon carbide substrate to form an active region from the first side;
forming a contact pad at the first side of the silicon carbide substrate, the contact pad being coupled to the active region;
forming a patterned protective layer covering the contact pad;
forming a ceramic stabilization layer over the active region and the contact pad, the ceramic stabilization layer configured to provide mechanical stabilization and support, the ceramic stabilization layer disposed between adjacent regions of the patterned protective layer;
removing the patterned protective layer to form the ceramic stabilization layer with a contact opening exposing the contact pad;
flipping the silicon carbide substrate and placing the ceramic stabilization layer with the contact opening over a carrier, the carrier comprising a recess to hold the silicon carbide substrate;
applying a high temperature glue along sidewalls of the silicon carbide substrate contacting the carrier to form a seal;
from the second side, thinning the silicon carbide substrate to expose a major surface;
forming a patterned mask layer under the exposed major surface of the silicon carbide substrate;
placing the silicon carbide substrate with the patterned mask layer within a plasma chamber and heating the silicon carbide substrate to a temperature greater than 300° C.; and
using an etch chemistry comprising an interhalogen compound comprising chlorine and fluorine and the patterned mask layer as an etch mask, etching through the silicon carbide substrate to expose the ceramic stabilization layer, wherein the seal prevents the etch chemistry during the etching from attacking the contact pad exposed through the contact opening.

23. The method of claim 22, wherein the interhalogen compound is chlorine tetrafluoride.

24. The method of claim 22, wherein the etch chemistry selectively etches the silicon carbide substrate relative to the ceramic stabilization layer.

25. The method of claim 22, further comprising:
after the etching, attaching a flexible carrier to the exposed major surface of the silicon carbide substrate; and
cleaving the ceramic stabilization layer to form a plurality of silicon carbide dies, wherein each of the plurality of silicon carbide dies comprising a portion of the ceramic stabilization layer and a portion of the silicon carbide substrate.

26. The method of claim 25, wherein cleaving the ceramic stabilization layer comprises separation by mechanical force.

27. The method of claim 25, wherein cleaving the ceramic stabilization layer comprises sawing the ceramic stabilization layer or stealth dicing the ceramic stabilization layer.

* * * * *